United States Patent
Daubenspeck et al.

(10) Patent No.: US 6,426,557 B1
(45) Date of Patent: Jul. 30, 2002

(54) SELF-ALIGNED LAST-METAL C4 INTERCONNECTION LAYER FOR CU TECHNOLOGIES

(75) Inventors: Timothy Daubenspeck, Colchester; Stephen E. Luce, Underhill; William Motsiff, Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/512,952

(22) Filed: Feb. 25, 2000

(51) Int. Cl.[7] .............................................. H01L 29/40
(52) U.S. Cl. ...................... 257/750; 257/774; 257/760; 257/761
(58) Field of Search ................................ 257/750–751, 257/760, 774, 761, 762; 438/652, 624, 648, 656, 683, 685, 687

(56) References Cited

U.S. PATENT DOCUMENTS

| | | | |
|---|---|---|---|
| 4,551,210 A | 11/1985 | Parthasarathi | 204/28 |
| 4,621,045 A | 11/1986 | Goodner | 438/626 |
| 5,393,697 A | 2/1995 | Chang et al. | 438/106 |
| 5,429,987 A | 7/1995 | Allen | 438/622 |
| 5,619,072 A * | 4/1997 | Mehta | 257/774 |
| 5,854,093 A | 12/1998 | McBride | 438/106 |
| 6,100,195 A * | 8/2000 | Chan et al. | 438/687 |
| 6,110,826 A * | 8/2000 | Lou et al. | 438/742 |
| 6,211,069 B1 * | 4/2001 | Hu et al. | 438/637 |
| 6,249,055 B1 * | 6/2001 | Dubin | 257/758 |
| 6,258,713 B1 * | 7/2001 | Yu et al. | 438/634 |
| 6,284,574 B1 * | 9/2001 | Petrarca et al. | 438/122 |
| 6,291,885 B1 * | 9/2001 | Cabral et al. | 257/751 |
| 6,309,970 B1 * | 10/2001 | Ito et al. | 438/687 |

* cited by examiner

Primary Examiner—Jasmine J B Clark
(74) Attorney, Agent, or Firm—Whitham, Curtis & Christofferson, P.C.; Mark F. Chadurjian

(57) ABSTRACT

A controlled collapse chip connection (C4) structure having stronger resistance to failure is constructed for use with integrated circuit devices having copper wiring. Failure resistance is obtained by replacing the mechanically weak final passivation to copper interface. The weak interface is eliminated by use of a specific peg on peg structure together with a layer of shunt metal having excellent adhesion and barrier characteristics. A shunt metal, e.g., Ta or TaN, is placed between both the copper and final passivation and the copper and C4 metals such that it overlaps the edge of the peg defined wiring mesh to encase the copper. Overlap is obtained by the peg on peg structure where a $SiO_2$ peg defines the copper wire mesh and a smaller $Si_3N_4$ peg placed on the $SiO_2$ peg defines the overlap above the mesh wire and provides the ability to pattern the overlayer shunt without exposure of the copper conductor.

7 Claims, 2 Drawing Sheets

SELF-ALIGNED LAST-METAL C4 INTERCONNECTION LAYER FOR CU TECHNOLOGIES

BACKGROUND OF THE INVENTION

1. Field of the Invention

The present invention generally relates to integrated circuit devices using copper wiring technology and more particularly to reducing failures at the interface between the last wiring level copper contact pad and the controlled collapse chip connect (C4) structure.

2. Background Description

Copper back end of line (BEOL) wiring technologies offer substantial performance and potential cost advantages over the traditional aluminum technologies used for integrated circuit device fabrication. However, copper metalization is inherently more process-sensitive than aluminum, and less compatible with established chip/packaging interconnection technology. Copper metal readily forms a native oxide, which is not self-passivating like that of aluminum, but rather can continue to react in the presence of air and moisture to form corrosion products. Additionally, some inorganic dielectric materials, in particular silicon nitride, which are used as a barrier layer to prevent copper diffusion into silicon dioxide, do not adhere well to copper.

Initial C4/packaging qualification work on CMOS technology produced a significant number of fails related to the delamination of the nitride barrier layer from the copper pad during chip-pull C4 testing. The preferred fail mode during these tests is for the C4 Pb/Sn ball to fail cohesively, in the manner of a "taffy pull".

As initially defined, CMOS technologies made use of a last-metal (LM) level copper pad overcoated with silicon nitride, the silicon nitride containing an open via (window) fully landed on the copper pad, as the contact point for ball limiting metallurgy (BLM)/C4 or wirebonding to a package. With this technology, it was observed that pull-testing of C4s produced significant levels of fails characterized not by cohesive C4 fail within the lead tin, but rather by separation at the copper interface with the passivating nitride barrier layer. This type of fail is catastrophic, often originating at the copper/nitride interface located immediately adjacent to the BLM pad edge, and pulling back across the entire pad and beyond, occasionally disrupting adjacent wiring line structures as well.

SUMMARY OF THE INVENTION

It is therefore an object of the present invention to provide improved adhesion of the C4 structure on copper by operating on the critical interface without introduction of critical photo layers, or increase in wiring line sheet resistance.

The disclosed structure entirely eliminates the critical copper/nitride interface that has been shown to fail during chip pull, while creating large areas of films and interfaces that are inherently strong. The structure does not increase wiring line electrical resistance (Rs) like copper silicide and it does not involve critical mask levels like full cladding options.

A typical structure for the final wiring level and its associated passivation overlayers consists of a last metal (LM) copper pad, covered with a tri-layer final passivation film stack comprised of an approximately 700 Å thick barrier layer immediately above the copper pad., an approximately 4500 Å thick PECVD oxide layer finished with an approximately 4500 Å thick PECVD nitride layer. A via window is imaged in the nitride/oxide/nitride layer and the window is fully contained on the underlayer copper pad. A polyimide layer optionally may be applied over the nitride/oxide/nitride to provide reduction of mechanical stress on the integrated circuit die induced by the packaging compound. If a polyimide layer is used, a via window is imaged concentric with the via window in the nitride/oxide/nitride.

Various attempts to improve nitride to copper adhesion so as to produce the desired failure mode during C4 (pull) test have proven to be marginally successful, have undesired attributes or are exceptionally difficult to manufacture. These attempts include forming oxide pillars within the bound of the copper pad for improved adhesion through increased nitride/oxide area percentage, formation of copper silicide prior to nitride deposition and cladding of the copper pad or pad plus associated wiring line with Ta or TaN. Oxide pillars reduce BLM to pad contact area and are marginally effective at changing failure mode. Copper silicide changes failure mode to the desired cohesive fail within the PbSn solder ball but also increases the resistance of the copper wiring conductor. Cladding with another material can be effective in changing the C4 failure mode, but introduces additional films deposition and imaging. Imaging in particular can be difficult in tight pitch wiring areas if a subtractive etch process is used, i.e. critical overlay, or in large copper pad areas if a damascene process is used, i.e. polish through. The current invention eliminates the problem nitride to copper interface in the pad area while avoiding challenging manufacturing processes.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

This invention makes use of an optimized pad design of the last metal copper pad structure. The structure is comprised of an array of silicon dioxide "pegs" arranged in a lattice work pattern throughout the damascene copper last-metal pad. The pegs provide supports to facilitate chemical mechanical polish (CMP) of the copper last metal and provide "islands" of good adhesion for a silicon nitride overlayer. Silicon dioxide peg size is large enough so that (after CMP of the copper last metal) a smaller peg of silicon nitride can be formed on top of the oxide peg using a non-critical block mask. For example, the silicon dioxide peg might be 10 $\mu$ square and the overlayer silicon nitride peg might be 7 $\mu$ square.

Figure 1:
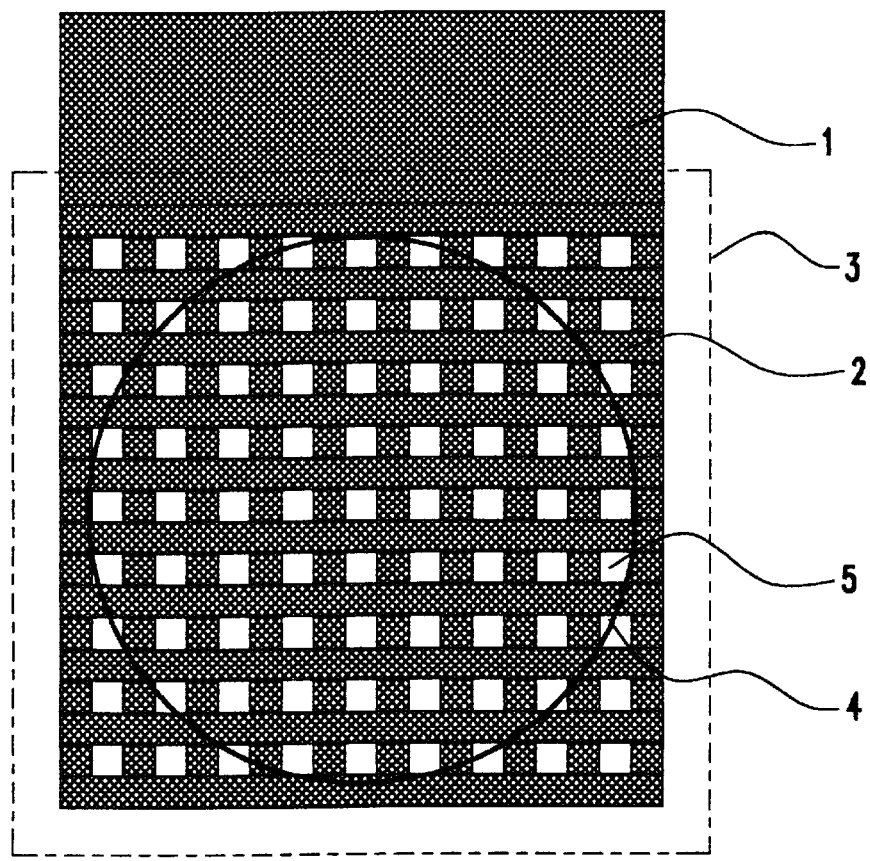
FIG. 1 is top view of a LM (last metal) C4 (Controlled, Collapse chip connection)pad structure.
Figure 2:
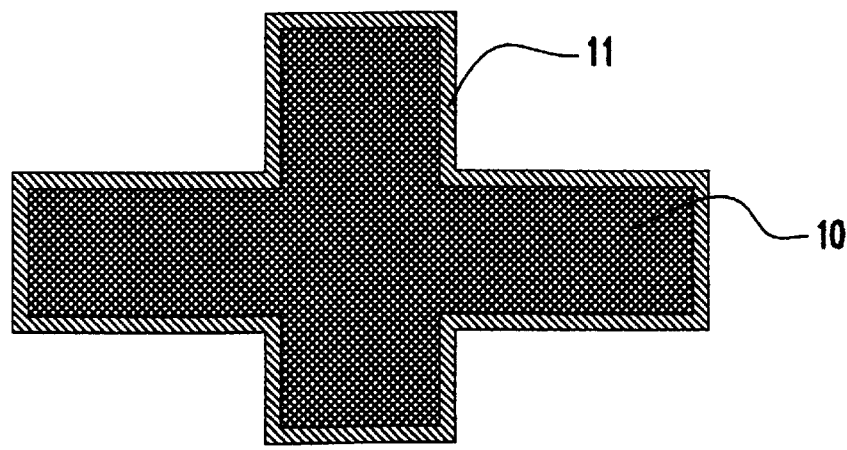
FIG. 2 is a detail of LM mesh.

FIG. 1 shows an example of an orthogonal copper wiring mesh with pegs. By designing the nitride peg mask so that the nitride peg is contained within the oxide peg structure, a narrow overlap of a metal (or stack of metals having the properties that the metal has good adhesion to copper, that silicon nitride has good adhesion to the metal and that the metal acts as a diffusion barrier to copper, e.g. metals or metals stacks comprised of Ta or TaN), extends from the area of copper coverage over the oxide structures as shown in FIGS. 1 and 2. The nitride peg plays a particularly important role as it prevents chemical-mechanical polish through of the overlayer metal as it is defined on the "large" last wiring layer terminal via pad.

This thin lip of refractory metal-to-silicon dioxide represents another strong interface which makes up the final element of the total structure that resists vertical deformation during pull-testing, temporary chip attach, or module rework. The silicon nitride pegs, used with subsequent film deposition and CMP processes define a fill matrix of refractory material with suitable adhesion and Cu barrier properties, that completely fills, and planarizes the spaces between the nitride pegs. By design, the refractory material completely overlaps the copper last metal and seals to the exposed edges of the silicon dioxide pegs. Direct interfacial contact between copper and nitride is eliminated and a superior copper/metal interface and a high-integrity nitride/oxide interface at each peg. In this manner also, the copper diffusion barrier property of the silicon nitride is assumed by the refractory layer locally at the edge of the overall last-metal pad, as well as at the edge of each of the pad "pockets" of copper that comprise the pad. Metals and metal stacks comprised of tantalum and tantalum nitride are suitable overlayer materials.

As can be seen in FIG. 1 a copper wire 1 ends in wire mesh 2. A hatched square 3 surrounding the wire mesh 2 represents the pad design size. The circle 4 marks the outline for forming a terminal via through the overlayer passivation to the mesh. An oxide peg 5 with nitride peg on top of it can be seen between wire mesh 2.

In FIG. 2 an enlargement of one of the intersections of the mesh is shown. The mesh is comprised of copper covered with metals and metal stacks comprised of TaN or Ta 10. Outer edges 11 are an area of TaN or Ta overlap of the copper.

Figure 3A:
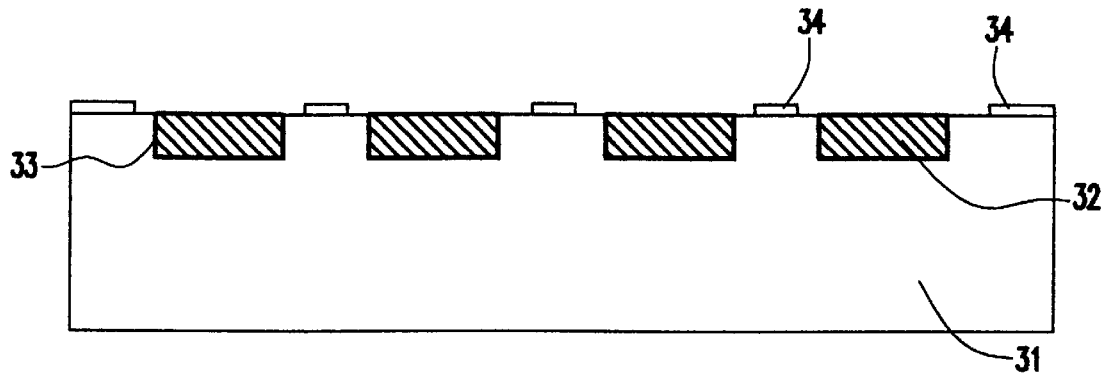
FIGS. 3A, 3B, and 3C show in cross sectional views the inventive structure during the process sequence of the present invention.

As can be seen in FIG. 3A, the beginning structure is the LM copper pad level, post-CMP using LM mask designed with oxide pegs as shown in FIG. 1. This beginning structure has a $SiO_2$ layer 31, having copper filled trenches 32. The sidewalls and bases of the trenches 32 are lined 33 to prevent outdiffusion. The liner may be comprised of refractory materials such as Ta or TaN. An approximately 2000 Å PECVD silicon nitride layer is deposited. The silicon nitride is patterned with positive photo resist, using nitride "peg" block mask. The pattern transfer is plasma etched with standard CF4-based RIE process, using a nitride etch process which is relatively selective to oxide, i.e., nitride is etched preferentially. One such etch process employs a mixture of etch gases comprised of Argon, $CF_4$ and $CHF_3$ and a LAM XL4250 etch tool. The resist is stripped by wet and/or dry process, to prevent Cu pad damage. Then the copper pad is cleaned with a dilute HF dip. Following this step $Si_3N_4$ pegs 34 can be seen between copper filled trenches 32.

Figure 3B:
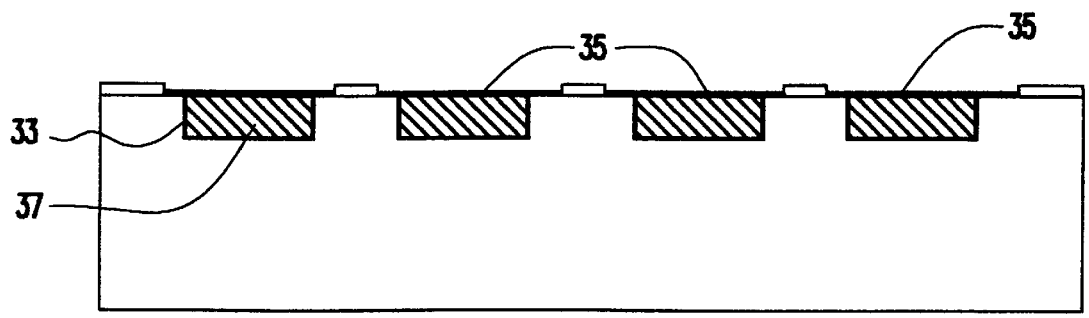

The results of the refractory overlayer shunt definition are shown in FIG. 3B. A sputter deposit of about 2000 Å of the refractory material is made over nitride peg mask. A chemical mechanical polish is made of the surface, leaving the refractory material in wells in contact with copper. With the refractory shunt 35 surface and liner 33 in the trenches 32, copper will not touch $Si_3N_4$.

Figure 3C:
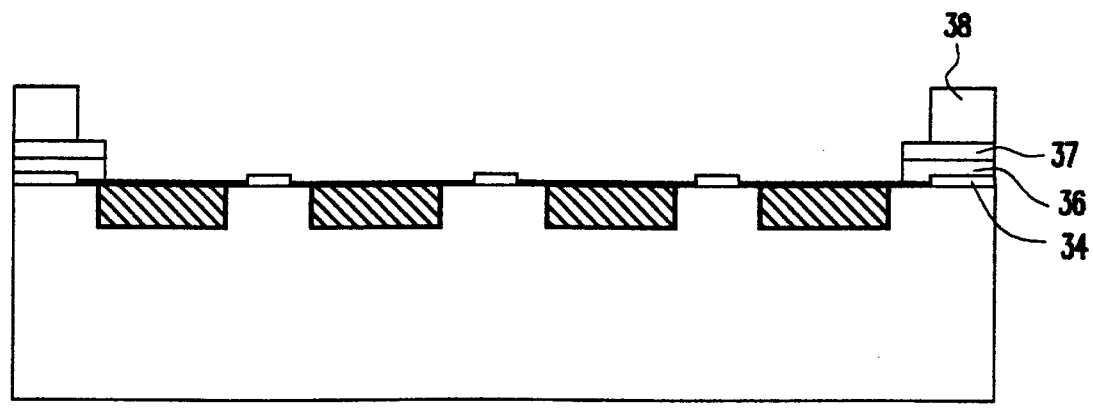

The via through the final passivation is shown in FIG. 3C. First, about 4500 Å PECVD oxide 36 is deposited followed by about 4500 Å PECVD nitride 37 as a normal final passivation step. The via window is opened in this dielectric stack using standard lithographic and reactive ion etching techniques. The portion of the reactive ion etch that removes the oxide under layer of the final passivation film stack is formulated to preferentially remove oxide and minimally attack nitride, thus preserving the underlayer nitride peg. An example of such an etch employs a mixture of etch gases comprised of Argon, $CF_4$ and CO and a LAM XL4250 etch tool. The image size of the via window through the nitride is designed such that the via always lands on the refractory mesh or the nitride peg and never on areas where there is only nitride over copper. The resist is removed using conventional wet and dry resist stripping techniques.

If it is elected to apply a layer of polyimide over the outermost nitride, after the resist is removed, a polyimide film 38 is spin applied and imaged, again using standard lithographic techniques, e.g. imaging a polyamic acid using a positive resist/wet aqueous alkali develop sequence, followed by removal of the resist and thermally curing the polyimide. A photosensitive polyimide developed using an organic solvent can be used in place of the traditional polyamic acid material if desired. In the case where polyimide is used, it is preferable to use the polyimide as the single etch mask for the nitride/oxide, further simplifying the manufacturing process. Clearly combinations of etching processes may also be employed, e.g. etching partially through the nitride/oxide stack prior to polyimide application and completing etching after polyimide imaging.

While the invention has been described in terms of a single preferred embodiment, those skilled in the art will recognize that the invention can be practiced with modification within the spirit and scope of the appended claims.

We claim:

1. A controlled collapse chip connection comprising:
   an $SiO_2$ dielectric layer having lined copper filled trenches;
   $Si_3N_4$ pegs on a $SiO_2$ surface between said trenches, wherein said pegs have a width less than said pegs are surface and wherein wdges of said pegs are discontinuous with edges of said trenches;
   a shunt deposited on a surface of said copper filled trenches, wherein a top surface of said shunt is even with a top surface of said pegs; and;
   a via opening comprised of edges each having a $Si_3N_4$ peg over a $SiO_2$ peg and overlapping a portion of said shunt.

2. A chip connection as in claim 1 wherein said copper filled trenches are lined with Ta, TaN or,Ta and TaN.

3. A chip connection as in claim 1, wherein said $Si_3N_4$ peg over said $SiO_2$ peg is smaller than said $SiO_2$ peg.

4. A chip connection as in claim 1 wherein said copper filled trenches are covered with said shunt and wherein said shunt is comprised of one or more of Ta, TaN, Al, Ti, TiN, and W.

5. A chip connection structure as in claim 1 wherein said lined, filled wiring trenches in a passivation via area are overlapped on all sides by said shunt.

6. A chip connection as in claim 4, wherein said copper filled trenches are lined with a material comprised of Ta or TaN or Ta and TaN.

7. A chip connection structure as recited in claim 5 wherein said passivation area is bounded by said edges comprising said via opening.

\* \* \* \* \*